United States Patent [19]

Rodseth et al.

[11] Patent Number: 4,546,408
[45] Date of Patent: Oct. 8, 1985

[54] ELECTRICALLY INSULATED HEAT SINK ASSEMBLIES AND INSULATORS USED THEREIN

[75] Inventors: William G. Rodseth, Elgin; Francis C. Peterson, St. Charles, both of Ill.

[73] Assignee: Illinois Tool Works Inc., Chicago, Ill.

[21] Appl. No.: 495,324

[22] Filed: May 16, 1983

[51] Int. Cl.[4] ............................................. H05K 7/20
[52] U.S. Cl. ..................... 361/386; 174/16 HS; 174/138 D; 361/388
[58] Field of Search .......... 174/16 HS, 138 D, 158 R, 174/159; 339/17 C, 17 CF, 112 R; 357/80, 81; 361/380–389, 400, 403, 417–420

[56] References Cited

U.S. PATENT DOCUMENTS

| | | | |
|---|---|---|---|
| 1,229,911 | 6/1917 | Dodds | 411/186 |
| 1,931,649 | 10/1933 | Eger | 411/188 |
| 2,305,654 | 12/1942 | Wilkinson | 411/171 |
| 2,432,986 | 12/1947 | Forman | 174/159 |
| 2,993,950 | 7/1961 | Forman | 174/138 D |
| 3,102,571 | 9/1963 | Scott | 174/159 |
| 3,249,680 | 5/1966 | Sheets | 174/16 HS |
| 3,272,952 | 9/1966 | McKeon | 174/138 D |
| 3,350,975 | 11/1967 | Bien | 411/437 |
| 3,369,597 | 2/1968 | Dronsuth et al. | 361/386 |
| 3,415,943 | 12/1968 | Meyerhoff | 174/52 H |
| 3,457,824 | 7/1969 | Derby | 411/429 |
| 3,494,243 | 2/1970 | Kleinhenn | 174/138 D |
| 4,266,267 | 5/1981 | Ruegg | 361/386 |
| 4,321,423 | 3/1982 | Johnson et al. | 361/386 |
| 4,403,102 | 9/1983 | Jordan et al. | 411/171 |
| 4,446,504 | 5/1984 | Jordan et al. | 357/81 |

FOREIGN PATENT DOCUMENTS 0659585  3/1963  Canada .......................... 174/16 HS Primary Examiner—Reinhard J. Eisenzopf
Assistant Examiner—Greg Thompson
Attorney, Agent, or Firm—David I. Roche; Thomas W. Buckman

[57] ABSTRACT

An insulator used in connecting heat generating electrical components to heat sinks. Fasteners which include insulators of the present invention include flexible engaging means for preassembling an insulating washer portion to a conductive fastener element. The insulators may be made of high performance plastic material or of a coated metal. The fasteners used with the insulators preferably have integral spring washers to maintain thermal conductivity between the components and the associated heat sinks. The insulator preferably have integral bosses which prevent arcing between the conductive fasteners and the heat sinks.

5 Claims, 9 Drawing Figures

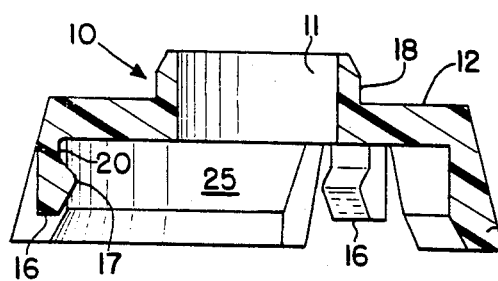
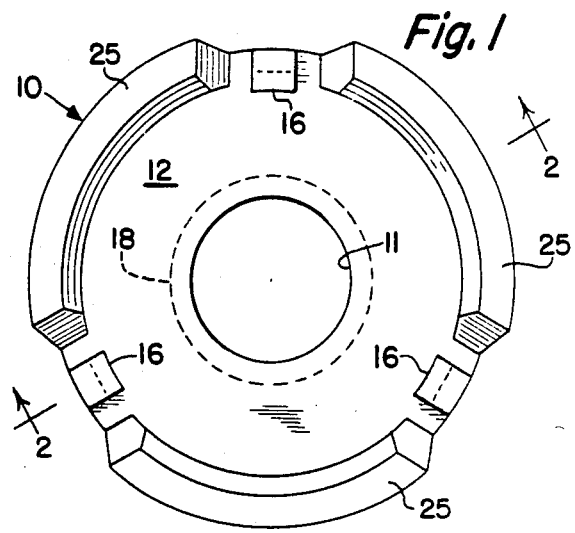
Fig. 1
Fig. 2
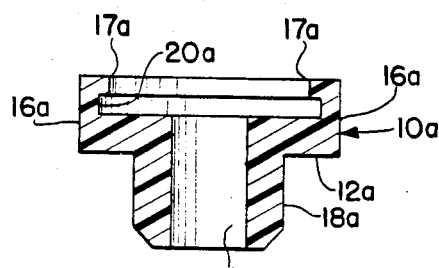
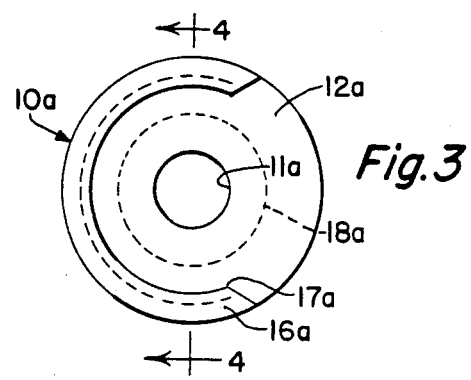
Fig. 3
Fig. 4
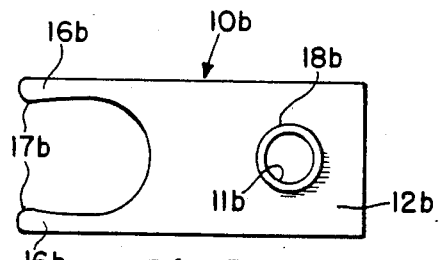
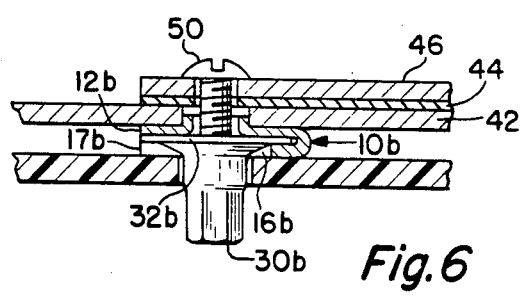
Fig. 5
Fig. 6
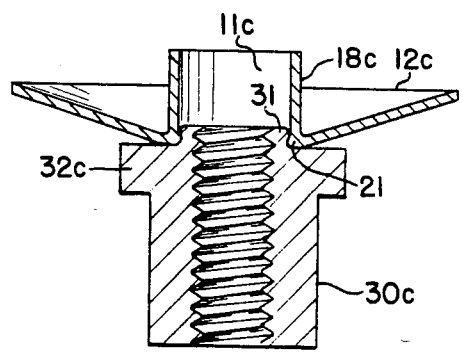
Fig. 7

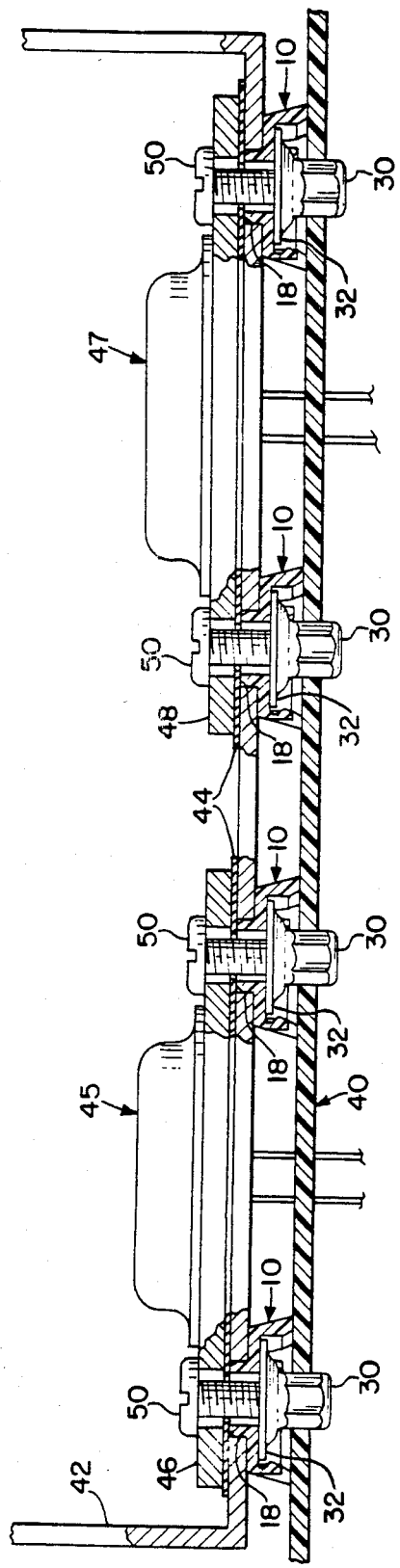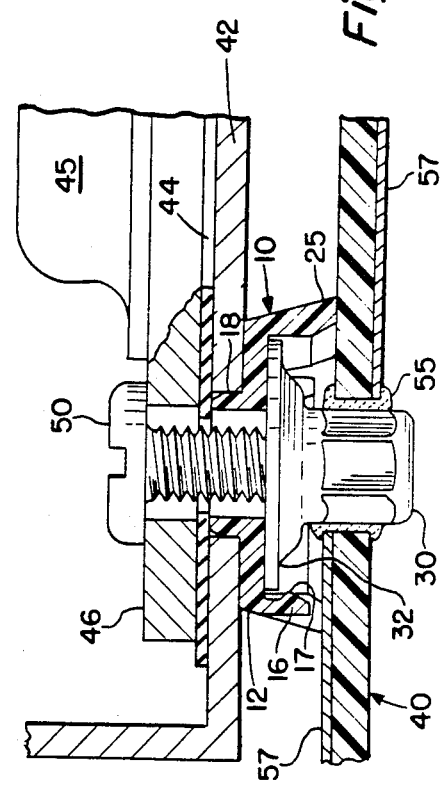

ELECTRICALLY INSULATED HEAT SINK ASSEMBLIES AND INSULATORS USED THEREIN

BACKGROUND AND SUMMARY OF THE INVENTION

This invention relates to electrical insulators, and in particular to insulators used in attaching heat sink assemblies comprising heat generating electronic components and heat dissipators to printed circuit boards. This invention is to some extent related to an invention described in application Ser. No. 434,816 filed Oct. 18, 1982, which is assigned to the assignee of the present invention. The No. 434,816 application is incorporated herein by reference.

The earlier application discloses a novel fastener which assures thermal conductivity between a heat generating component and a heat sink. In some circuit designs, however, it is desirable to attach a plurality of such components to a single heat sink. In many heat generating components, the base or support of the component also serves as a terminal for the component. In many transistors the collector terminal is connected to a circuit through mounting hardware. The mounting hardware, is in effect, a circuit element. If a plurality of components are attached to a single heat sink, the heat sink will tend to allow current to flow directly between the components. It is therefore sometimes necessary to mount components in such a way as to promote thermal conductivity, while at the same time preventing electrical conductivity, between the components and the heat sink.

Accordingly, it is an object of the present invention to provide an electrical insulator which is able to be preassembled to a fastener used to connect components to a heat sink.

Another object is to provide an insulator which is capable of withstanding continuous clamp load between heat sinks and mounting fasteners while maintaining electrical isolation between them.

Yet another object is to provide a preassembled fastener and insulator combination which facilitates assembly of heat generating electrical components to a heat sink while preventing short circuits among the components.

Still another object of the invention is to provide a heat sink assembly having a plurality of components which may be quickly and easily connected to a printed circuit board.

These and other objects and advantages are achieved with an insulator which is preassembled to an electrically conductive fastener. The insulator may be made of plastic or it may be metallic with a non-conductive coating, such as hard anodized aluminum. Either the fastener or the insulator preferably has an integral spring flange to maintain clamp load and thermal conductivity between components and an associated heat sink. In a heat sink assembly having a plurality of components, the insulators are positioned generally at the interface between the conductive fastener and the heat sink. Preferably, the insulator has a boss which extends into an aperture in the heat sink.

The various embodiments of the present invention will be better understood upon a reading of the following specification read in conjunction with the attached drawings.

DETAILED DESCRIPTION OF THE DRAWINGS

FIG. 1 is a plan view of an embodiment of an insulator of the present invention.

FIG. 2 is a sectional view of the insulator shown in FIG. 1 taken along line 2—2 therein.

FIG. 3 is a plan view of an alternative embodiment of an insulator in accordance with the present invention.

FIG. 4 is a sectional view of the insulator shown in FIG. 3 taken along line 4—4 therein.

FIG. 5 is a plan view of a partially formed alternative embodiment of an insulator of the present invention.

FIG. 6 is an elevational view in partial section of a a fastener and insulator in accordance with the present invention.

FIG. 7 is an alternative embodiment of a fastener in accordance with the present invention.

FIG. 8 is an elevational view in partial section of a fastner of the present invention which incorporates the insulator shown in FIGS. 1 and 2.

FIG. 9 is an elevational view in partial section of a heat sink assembly in accordance with the present invention.

DETAILED DESCRIPTION OF THE PREFERRED EMBODIMENTS

FIGS. 1 and 2 show an insulator 10 having a laterally extending base or washer portion 12 and an axially projecting boss or bushing 18. Depending from the base 12 are three flexible and preferably resilient arms 16. Radially inwardly projecting portions 17 on the arms 16 create a recess 20 adapted to receive a flange on a fastener in an interfering engagement. The base 12 also carries three spacing legs 25 which extend generally axially from the base 12. The legs 25 are longer than the arms 16 and preferably extend radially outwardly to some extent. The legs 25 provide enhanced stability to a flanged fastener when attached to a heat sink and placed on a printed circuit board as shown in FIG. 9. The legs 25 also act as spacing means to facilitate dissipation of heat by a heat sink by allowing air flow around the heat sink. The spacing means or legs 25 are intermittently placed about the periphery of the base 12 to allow venting of fluids and to promote electrical connection in a wave soldering operation. The boss 18 has an aperture 11 which extends through the base 12 and is adapted to receive an elongated portion of a fastener, such as a screw shank.

FIGS. 3 and 4 are views of an alternative or second embodiment of the insulator of the present invention. In this embodiment 10A the arms 16a are substantially continuous over a major portion of the perimeter of the base 12a. The arms 16a have inwardly projecting portions 17a which define a recess 20a which is adapted to engage a flanged fastener. In this embodiment the flange is brought into engagement with the arms 16a from a direction generally perpendicular to the axis of the boss 18a and aperture 11a. This differs from the embodiment of FIGS. 1 and 2 wherein a fastener is engaged with the legs 16a from a generally axial direction. In both of the above embodiments, the portions of the insulator which would contact the printed circuit board, i.e., the under surface of the base 12a, is interrupted to preclude the creation of hydrostatic forces in a wave soldering operation. The insulator includes an aperture 11a.

The embodiments of FIGS. 1-4 and FIGS. 8 and 9 show a plastic insulator. In these embodiments a high performance plastic is preferred because significant thermal cycling can be expected. A fiber reinforced polyphenylene sulfide material such as Ryton ® PPS resin has been found to be an excellent material.

FIGS. 5 and 6 show a third embodiment of the insulator of the present invention. In this embodiment the insulator is metallic and has a layer of non-conductive material (not shown). The layer is preferably a hard anodized oxide formed on an aluminum base. However, any base material could be used with a coating such as porcelain or the like. The structure of this third embodiment 10b is similar to that shown in the molded embodiment of FIGS. 3 and 4. FIG. 5 shows the third embodiment in a partially formed state. In FIG. 6 the legs 16b are shown folded under the base 12b to form the preassemblable insulator. The arms 16b have projections 17b adapted to engage a flanged fastener. As in the second embodiment shown in FIGS. 3 and 4, the legs form a substantially U-shaped member which lies generally parallel to the base 12b. The boss 18b projects in a generally axial direction from a side of the base 12b which is opposite the side from which the arms 16b depend. FIGS. 6 and 8 show the heat sink 42, and a screw 50 in inserted therein. The insulator includes an aperture 11b. A nut 30b includes a conical springe glange 32b which is engaged by the projections 17b at the ends of the arms 16b. The insulator 10b and the mica film 44 prevent current flow from the transistor support 46 through the screw 50 and nut 30b into the heat sink 42, while allowing current flow from the support 46 to the circuit board.

FIG. 7 shows another embodiment of the present invention. Here a stamped metal insulator having a boss 18c and an integral spring washer 12c has a non-conductive coating (not shown) as discussed above. A nut 30c, which may have a flange 32c, has a collar 31c which is plastically deformed into engagement with an inwardly projecting rim 21 on interior of the insulator. The insulator includes an aperture 11c.

The embodiments of FIGS. 1–4 are two examples of ways in which an insulator may be pre-assembled to a threaded fastener. These embodiments use resilient elastic deformation. In contrast, FIG. 7 shows the use of plastic deformation to pre-assemble an insulator and a fastener. It should be noted that various other methods of attachment may be used. These methods include sonic and friction welding (i.e., plastic deformation). The methods apply to all of the embodiments of the present invention. For example, in the embodiments of FIGS. 1–4, the insulator may be sonically welded to a fastener, in which case the resilient arms 16 would be unnecessary.

FIGS. 8 and 9 show a typical environment in which the present invention is advantageous. A first transistor 45 is mounted onto a heat sink 42 with a thin mica film 44 electrically separating them. An electrically conductive fastener comprised of a screw 50 and a nut 30 are used to carry current from the transistor support 46 (collector) to the printed circuit board 40, where a solder connection 55 is made to circuitry 57. The nut 30 has an integral flange 32 which snaps into engagement with the arms 16 and provides clamp load between the transistor 45 and the heat sink 42 to maintain thermal conductivity therebetween. The boss 18, projecting from the base 12 of the insulator 10, fits into an aperture in the heat sink 42 in order to prevent arcing between the screw 50 and the heat sink 42. The problem or arcing exists when there is electrical potential between the screw and the heat sink. Isolation of the heat sink 42 is also important, albeit not exclusively, when a circuit includes an assembly as shown in FIG. 9 where the supports 46 and 48 of the transistors 45 and 47, respectively, are terminals (collectors) requiring connection to the circuitry of the printed circuit board 40.

The invention has been described as encompassing various embodiments. It is evident that many of the embodiments are substantially equivalent and may therefore be substituted without departing from the spirit and scope of the invention. Similarly, it is evident that many modifications will be apparent to those skilled in the art. Accordingly the invention is intended to embrace all such modifications and substitutions as fall within the spirit and scope of the appended claims.

We claim:

1. A fastener for use in attaching components to and electrically isolating components from an electrically conductive support comprising, an internally threaded electrically conductive fastening element having a generally elongated nut body 30 and an integral flange 32 at one end of said body, said body being insertible into an apertured circuit board, an insulating member 10 carried by and adjacent to said flange preventing electrical current flow from said flange, and preassembly means, 16 and 17 connecting said insulating member to said fastening element.

2. A fastener in accordance with claim 1 wherein said preassembly means comprises a portion of said insulating member, said portion being in positively interferring engagement with said fastening element.

3. A fastener in accordance with claim 2 wherein said flange is resiliently deformable such that a clamping load is maintainable between said fastening element and said support.

4. A fastener in accordance with claim 1 wherein said insulating member includes a generally planar base and a boss projecting therefrom.

5. A fastener for use in attaching heat generating electrical components to and electrically isolating said components from a conductive heat dissipating device, said fastener comprising an internally threaded nut body 30, a flange 32 integrally formed at one end of said body, said flange being a resiliently deformable spring flange to maintain a clamp load despite changes in temperature of said fastener, a thermal insulating element 10 of plastic material in positively interferring pre-assembled engagement with said fastener, said insulating element being carried by and disposed adjacent to said flange opposite said body, said insulating element having an upstanding boss 18 extending in a direction opposite said body.

* * * * *